US007009237B2

(12) United States Patent
Adkisson et al.

(10) Patent No.: US 7,009,237 B2
(45) Date of Patent: Mar. 7, 2006

(54) OUT OF THE BOX VERTICAL TRANSISTOR FOR EDRAM ON SOI

(75) Inventors: James W. Adkisson, Jericho, VT (US); Gary B. Bronner, Stormville, NY (US); Dureseti Chidambarrao, Weston, CT (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 10/709,450

(22) Filed: May 6, 2004

(65) Prior Publication Data

US 2005/0247966 A1 Nov. 10, 2005

(51) Int. Cl.
*H01L 27/108* (2006.01)

(52) U.S. Cl. ...................................... 257/301; 257/302

(58) Field of Classification Search ................ 257/301, 257/302, 296; 438/241–243
See application file for complete search history.

(56) References Cited

U.S. PATENT DOCUMENTS

| | | | | |
|---|---|---|---|---|
| 6,426,252 | B1 | 7/2002 | Radens et al. | |
| 6,429,477 | B1 | 8/2002 | Mandelman et al. | |
| 2002/0076880 | A1 * | 6/2002 | Yamada et al. ............. | 438/243 |

* cited by examiner

*Primary Examiner*—Cuong Nguyen
(74) *Attorney, Agent, or Firm*—Scully, Scott, Murphy & Presser; Joseph P. Abate, Esq

(57) ABSTRACT

The present invention provides a vertical memory device formed in a silicon-on-insulator substrate, where a bitline contacting the upper surface of the silicon-on-insulator substrate is electrically connected to the vertical memory device through an upper strap diffusion region formed through a buried oxide layer. The upper strap diffusion region is formed by laterally etching a portion of the buried oxide region to produce a divot, in which doped polysilicon is deposited. The upper strap region diffusion region also provides the source for the vertical transistor of the vertical memory device. The vertical memory device may also be integrated with a support region having logic devices formed atop the silicon-on-insulator substrate.

10 Claims, 9 Drawing Sheets

OUT OF THE BOX VERTICAL TRANSISTOR FOR EDRAM ON SOI

BACKGROUND OF INVENTION

The present invention relates to electronic devices, and more particularly to vertical memory devices, such as eDRAM devices, formed within a silicon-on-insulator (SOI) substrate.

Dynamic Random Access Memory (DRAM) cells are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically orientated capacitors within each deep trench. Thus, the surface area required for the storage capacitor is dramatically reduced without sacrificing capacitance, and correspondingly, storable charge. Each deep trench may have a depth on the order of 1 μm or greater. In order to further decrease the density of the device, the access transistor can also be positioned in a vertical orientation, as opposed to a planar orientation.

Vertical memory devices are advantageous, in comparison to planar memory configurations, for increased density, performance and lithographic considerations. Vertical memory devices increase density by reducing the cell area of each memory device, therefore allowing for closer positioning of adjacent memory devices. Additionally, each vertically orientated access transistor within each vertical memory device essentially contains a double gate, therefore allowing for increased drive current, in comparison to a single gate utilized in planar access transistors.

There is interest in integrating the excellent drive current and density of vertical memory devices with the superior logic devices that can be formed on silicon-on-insulator (SOI) substrates, to obtain vertical memory embedded dynamic random access memory (eDRAM). SOI substrates reduce parasitic capacitance within the integrated circuit and reduce individual circuit loads, thereby improving circuit and chip performance.

Previous attempts to integrate vertical eDRAM devices with SOI technology have encountered a number of disadvantages. For example, since the trenches, in which vertical eDRAM devices are positioned, typically extend through the buried insulating layer of the SOI substrate, electrical communication must be provided to the memory capacitor through the buried insulating layer. In prior devices, if the vertical device is positioned below the buried insulating layer, the buried insulating layer produces a vertical discontinuity, where electrical communication to the memory device is negatively impacted. Additionally, the thickness of the upper silicon containing layer of the SOI substrate, typically being on the order of about 70 nm to about 100 nm, is too thin to accompany the formation of the entire vertical device without extending into the underlying buried insulating layer.

A vertical memory device is needed that may be integrated with an SOI substrate, where electrical communication from the top surface of the SOI substrate to the access transistor of the memory device is provided without substantially affecting the memory device's physical orientation.

SUMMARY OF INVENTION

An object of the present invention is to provide a vertical memory device, such as an eDRAM, in an SOI substrate. It is another object of the present invention to provide a vertical memory device within an SOI substrate, in which the vertical memory device is in electrical contact through the buried insulating layer of the SOI substrate to a bitline positioned on the SOI substrate's surface.

These and other objectives are achieved in the present invention by circumventing the buried insulating region of the SOI substrate through an out of buried insulating region contact, where the bitline contacting the SOI layer is electrically connected to the memory device. The term "out of buried insulating region contact" is meant to denote that electrical contact to the memory device is established through the buried insulating layer by an upper strap diffusion region formed in a laterally etched divot region. The out of buried insulating region contact may also be referred to as an "out of the box contact", when the buried insulating region is an oxide. The upper strap is formed by laterally etching a portion of the buried insulating region to produce a divot, in which doped polysilicon is deposited. In addition to providing electrical conductivity, the upper strap diffusion region functions as the source of the access transistor. In broad terms, the inventive vertical memory device comprises: a substrate comprising a silicon-containing layer atop an insulating layer; at least one trench within the substrate, the at least one trench comprising a divot laterally extending from a trench sidewall into the insulating layer; a capacitor in a lower portion of at least one trench; and a transistor in an upper portion of at least one trench, the transistor in electrical contact to the silicon-containing layer of the substrate through an upper strap diffusion region partially positioned within the divot of the trench.

The present structure provides a means to connect a bitline directly from the surface of the substrate to the access transistor of a memory cell device. Specifically, an upper strap diffusion region electrically connects the upper silicon-containing layer of the substrate, hereafter the SOI layer, to the memory device through the buried insulator layer. The upper strap diffusion region can be positioned within a divot laterally extending from the trench sidewall into the insulating layer of the substrate, in which the upper strap diffusion region also functions as the source of the vertical transistor. The lower strap diffusion region provides electrical communication between the transistor and the capacitor and functions as the drain of the vertical transistor. The upper and lower strap diffusion regions may comprise doped silicon having a first conductivity-type dopant, where the portion of the substrate separating the upper and lower strap diffusion regions is doped with a second-conductivity dopant.

The above memory cell device can be incorporated with at least one logic device. For example, the substrate can comprise an array region and a support region separated by an isolation region, in which the array region can include at least one of the above memory devices and the support region can comprise a logic device. The logic device can be a polysilicon gate device having source/drain regions formed in the SOI layer of the substrate.

Another aspect of the present invention is a method of forming a memory device in a silicon-on-insulator substrate, in which an upper strap region provides electrical communication between the silicon-containing layer (SOI layer) of the substrate and the memory device.

Broadly, the inventive method comprises: forming at least one trench in a substrate, where the substrate comprises a silicon-containing layer atop an insulating layer, the at least one trench is formed to a depth extending through the insulating layer; forming a node dielectric and a collar in the at least one trench, the collar being positioned above the node dielectric; forming a capacitor node in a lower portion of the at least one trench; recessing the collar below a top surface of the capacitor node to expose a portion of the insulating layer and laterally etching the insulating layer to provide a divot; forming strap diffusion regions, comprising a lower strap diffusion region partially positioned on the collar and an upper strap diffusion region partially positioned in the divot, wherein the upper strap diffusion region is in electrical contact with the silicon-containing layer; depositing a trench top oxide on the capacitor node; forming a transistor atop the trench top oxide, the transistor comprising a source region that is the upper strap diffusion region and a drain region that is the lower strap diffusion region; and forming a via interconnect to an upper silicon-containing layer of the substrate, wherein the via interconnect is in electrical contact with the transistor through the upper strap diffusion region.

The trenches in the substrate may be provided by forming a patterned pad layer atop the substrate and then directionally etching the exposed portions of the substrate selective to the patterned pad layer. The collar can be recessed with a directional etch process, which recesses the collars selective to the patterned pad layer and the capacitor node. The divot regions may be formed by a non-directional etch process selective to the patterned pad layer and the trench sidewall.

Strap regions may be formed by conformally depositing doped polysilicon within the trenches followed by directionally etching. Following the etch, a remaining portion of polysilicon is positioned within the divot and atop the recessed surface of the collar. The polysilicon within the divot provides an upper strap diffusion region. Dopant from the polysilicon diffuses into the surrounding silicon of the substrate and functions as the source of the subsequently formed vertical transistor. The polysilicon positioned atop the recessed surface of the collar provides the lower strap diffusion region. Dopant from the polysilicon diffuses into the surrounding silicon of the substrate and functions as the drain of the subsequently formed vertical transistor.

The gate region includes a gate dielectric that is thermally grown on the upper trench sidewalls and a polysilicon gate. The gate region in conjunction with the upper strap and the lower strap diffusion regions provide an access transistor to the underlying capacitor, in which the access transistor has a vertical orientation. The interconnect via to the upper silicon containing layer of the substrate may be a bitline.

The above method can be utilized to provide memory devices within an array region of the device, while a support region of the substrate provides logic devices. First, an array region wiring dielectric is formed atop the substrate and patterned to expose a portion of the substrate to provide an isolation region. Following a conventional etch and a trench fill process, the isolation trench separates the support region from the array region, where the array region comprises the memory devices. The support region of the substrate can be processed to provide logic regions.

DETAILED DESCRIPTION

Figure 1:
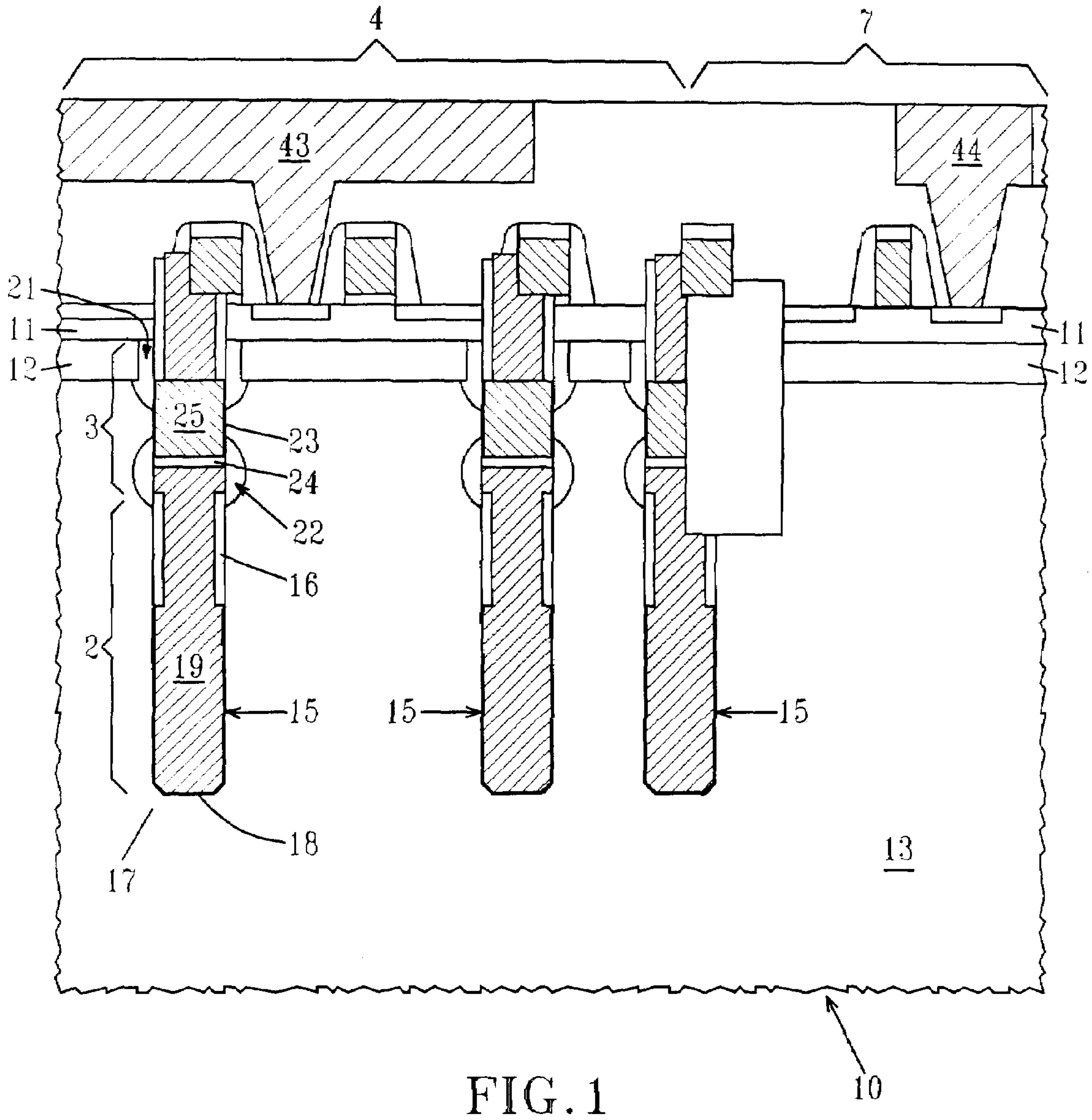
FIG. 1 is an illustration of a cross-sectional view of one embodiment of the present memory array and support array regions formed within a silicon-on-insulator substrate, in which the memory array includes memory devices having an out-of-buried insulator upper strap and the support region includes logic devices.

A memory array and support structure in SOI substrates, and method of forming the same, will now be discussed in greater detail by referring to the drawings that accompany the present application. In the accompanying drawings, like and corresponding parts are referred to by like reference numbers. Although the drawings show the presence of an array region containing only two memory devices and a support region containing only a single logic device, multiple memory devices and multiple logic devices are also within the scope of the present invention.

The present memory array and support structure combines the high-drive current and high-density characteristics possible in a vertical memory device, with the superior logic devices formed on a silicon-on-insulators (SOI) substrate. The advantages of forming logic devices on SOI substrates include higher packing density, the reduction of latch-up effects, lower junction capacitance, suitability to low-voltage applications, and higher performance.

Referring to FIG. 1, the SOI substrate 10 includes an upper Si-containing layer (SOI layer) 11, a buried insulating region 12, and a bulk silicon portion 13. The array region 4 comprises at least one trench 15, where each trench 15 may comprise a memory device. Each memory device comprises a capacitor 2 and an access transistor 3 separated by a trench top oxide 24.

The access transistor 3 comprises a gate conductor 25, a gate dielectric 23, and source and drain regions. The source and drain regions are the upper strap diffusion region 21 and the lower strap diffusion region 22. The upper strap diffusion region 21 is formed from outdiffused dopant from the polysilicon that is positioned within a divot extending from the trench sidewall into the buried insulating region 12. The lower strap diffusion region 22 is formed from dopant outdiffused from the polysilicon that is positioned atop the collar 16 of the device. The upper strap diffusion region 21 provides electrical communication between the source of the access transistor and the SOI layer 11 through the buried insulating layer 12. A bitline 43, which is in electrical contact with the SOI layer 11, is also in electrical contact to the memory device through the upper strap diffusion region 21. The lower strap diffusion region 22 may function as the drain of the access transistor 3 and is positioned to provide electrical contact between the access transistor 3 and the underlying capacitor 2.

The upper strap 21 and lower strap 22 diffusion regions can be doped with a first conductivity type dopant, while the portion of the substrate separating the upper and lower strap diffusion regions 21, 22 may be doped with a second type dopant. Preferably, the dopants may be selected to provide an nFET access transistor 3. Alternatively, the dopant may be selected to provide a pFET access transistor 3.

The capacitor 2 is formed underlying the access transistor 3 in a lower portion of the trench 15. Each capacitor 2 comprises a lower capacitor plate 17 and an upper capacitor plate 19 separated by a node dielectric 18. The support region 7 may include logic devices such as nFETs and pFETs. The method for forming the memory array and support structure depicted in FIG. 1 is now described in greater detail referring to FIGS. 2–9.

Figure 2:
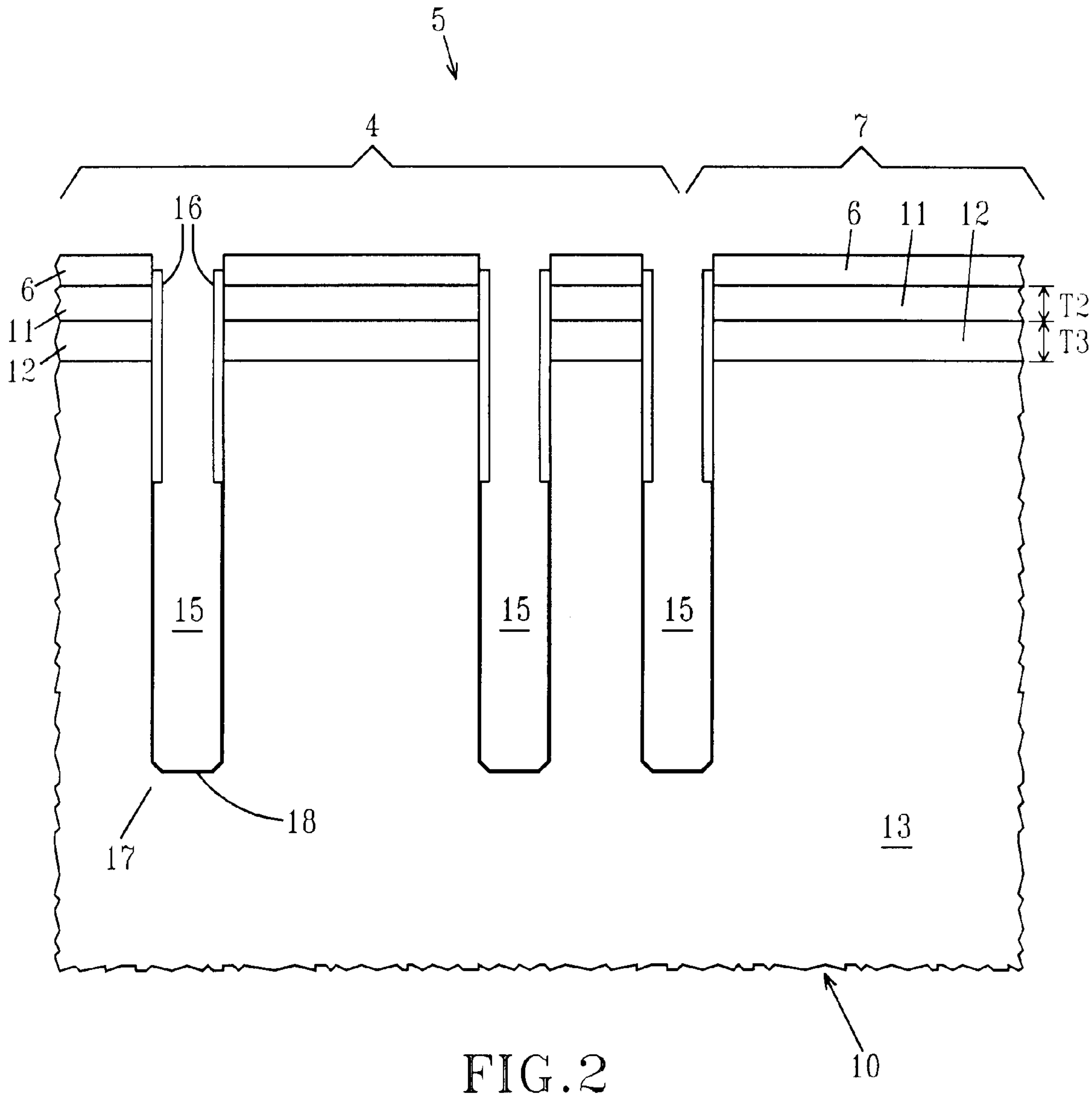
FIGS. 2–9 illustrate (through cross-sectional view) the process steps for producing the memory array depicted in FIG. 1.

Referring to FIG. 2 an initial structure 5 is provided including a pad dielectric layer 6 atop a silicon-on-insulator (SOI) substrate 10, in which the SOI substrate 10 includes trench regions 15 formed therein. Each trench region 15 further comprises a collar region 16 positioned on the sidewall of an upper portion of the trench 15; a lower capacitor plate 17 positioned in a lower portion of the trench 15; and a node dielectric 18 positioned along the sidewall of at least the lower portion of the trench 15.

The SOI substrate 10 is fabricated using techniques well known to those skilled in the art. For example, the SOI substrate 10 can be formed by a thermal bonding process, a layer transfer process, or alternatively, the SOI substrate 10 can be formed by an oxygen implantation process, which is referred to in the art as separation by implantation of oxygen (SIMOX).

The upper silicon-containing layer 11, hereafter referred to as an SOI layer 11, may be a Si-containing layer having a thickness T2 ranging from approximately 20 nm to approximately 100 nm. The term "Si-containing layer"as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the Si-containing layer 11 of the SOI substrate 10. The buried insulating region 12 is typically a buried oxide layer, which may have a thickness T3 ranging from about 150 nm to about 200 nm. The thickness of the bulk Si layer 13, underlying the buried insulating region 12, is not pertinent to the present invention.

The SOI layer 11 is doped to provide suitable electrical conductivity for a conduction path from a subsequently formed bitline 43 to the subsequently formed memory devices. Preferably, the SOI layer 11 is doped to provide $n^+$ type silicon. Conventional processes, such as ion implantation, may introduce the dopant. Alternatively, the SOI layer 11 can be in-situ doped. In one embodiment, a photoresist block mask (not shown) may be formed to selectively implant the array region 4, while a remaining portion of the substrate underlying the photoresist block mask is protected. The protected region of the SOI substrate 10 may then be subsequently processed to form the support region 7.

A dielectric layer 6 is formed atop the SOI substrate 10. The dielectric layer 6 is deposited by chemical vapor deposition (CVD) and related methods and can comprise nitride, oxide, or oxynitride materials, preferably being $Si_3$ N 4. Following deposition, the dielectric layer 6 is patterned to provide an etch mask for the subsequently formed trench regions 15 using photolithography and an etch process.

Trench regions 15 are then formed into the SOI substrate 10 using a timed etch process that is highly selective for removing SOI substrate 10, as opposed to the patterned pad dielectric layer 6 and the buried insulating layer 12. The selective etch process may be selected from the group comprising of, but not limited to: reactive ion etch (RIE), ion-beam etching, plasma etching or any other like dry etch process. The final depth of each trench 15 measured from the top surface of the SOI substrate, is greater than about 1 $\mu$m, preferably being from about 4 $\mu$m to about 10 $\mu$m. The trenches 15 are formed in rows and columns of the Si-containing substrate. The trenches 15 provide the areas within the array region 4, in which the storage capacitor 2 and access transistors 3 are formed.

In one embodiment, the trench regions 15 may be formed by a first etch, which defines the depth of the bottom surface of the subsequently formed collar 16 from the top surface of the SOI substrate 10, followed by another etch that defines the final depth of the trenches 15 from the surface of the substrate.

In this embodiment, the collar 16 is formed following the initial trench etch and prior to additional etching, which provides the final trench depth. A dielectric material is conformally deposited within the trench following the initial trench depth etch by a deposition process, such as chemical vapor deposition or related processes. The dielectric material can be any dielectric material including oxides, nitrides, and/or oxynitrides. The horizontal surface of the dielectric material within the trench is then etched using a conventional directional etch process, such as reactive ion etch, where the remaining portion of the dielectric material positioned on the trench sidewalls provides the collar 16. Following the formation of the collar 16, additional trench etching selective to the patterned pad dielectric layer 6 and the collar 16 provides the final depth of the trenches 15.

In another embodiment, the collar 16 may be formed after the trench regions 15 are etched to their final depth. More specifically, a dielectric material, preferably an oxide, is formed by a deposition process, such as chemical vapor deposition (CVD), plasma enhanced CVD (PECVD), high density (CVD)(HDCVD) or chemical solution deposition. Alternatively, the dielectric material can be formed using a local oxidation of silicon (LOCOS) like process including a thermal process, such as oxidation, nitridation, and oxynitridation.

Following deposition, the dielectric material can be removed from the lower portion of the trench using etch processes, including dry and/or wet etching, where the remaining portion of the dielectric material remains in the upper portion of the trench providing the collar 16, as depicted in FIG. 2.

Regardless of the processed used, the collar 16 preferably comprises $SiO_2$ and has a thickness ranging from about 20 nm to about 40 nm. The thickness of the collar region 16 is preferably minimized to provide the greatest area for subsequent polysilicon fill, so long as the thickness of the collar 16 is sufficient to suppress conduction of a parasitic transistor, which is subsequently formed between the lower strap diffusion region 22 and trench capacitor 2.

In another embodiment of the present invention, a body contact may be formed following trench formation 15, using the trench opening and depositing the appropriate contact material. The appropriate contact materials may be doped polysilicon or metals, such as W.

Next, a lower capacitor plate 17 is formed about the exterior walls of the lower trench regions using a process that is capable of diffusing dopant through the trench walls into the portion of substrate surrounding the lower trench. Preferably, the lower capacitor plate 17 is formed using $n^+$ dopants by introducing a dopant source to the sidewalls of the trench and then thermally diffusing the dopant into the substrate 10. The dopant may be introduced by ion implantation or by depositing a layer of n-type doped material, such as arsenic doped silicate glass. The dopant may be diffused by thermal methods, such as by a rapid thermal anneal.

Following lower capacitor plate 17 formation, a node dielectric 18 is then formed along the trench sidewalls. Specifically, a node dielectric layer 18 may be conformally formed on the sidewalls and base of the lower trench region 15 using deposition methods, such as CVD or plasma-enhanced CVD. The node dielectric 18 comprises any dielectric material including, but not limited to: $Si_3N_4$, $SiO_2$, $Al_2O_3$, $ZrO_2$, and $HfO_2$. In a preferred embodiment, the node dielectric 18 comprises $Si_3N_4$. The node dielectric layer 18 typically has a thickness ranging from about 1 nm to about 7 nm, with a thickness of from about 1.5 nm to about 3 nm being more typical.

In another embodiment of the present invention, the node dielectric 18 may be formed using a thermal growth processes, such as thermal nitridation. In this embodiment, the thermally grown nitride dielectric layer is not formed along the region of the trench sidewall that abuts the buried insulating layer 12. Since the node dielectric 18 does not form along the buried insulating layer 12, the buried insulating layer 12 may be laterally etched to provide a divot region 20, prior to the formation of the collar. The divot region 20 may then be filled with doped polysilicon for producing the upper strap diffusion regions 21. Therefore, forming the node dielectric 18 by thermal growth processes provides that the upper strap diffusion region 21 may be formed prior to the formation of the collar 16.

Figure 3:
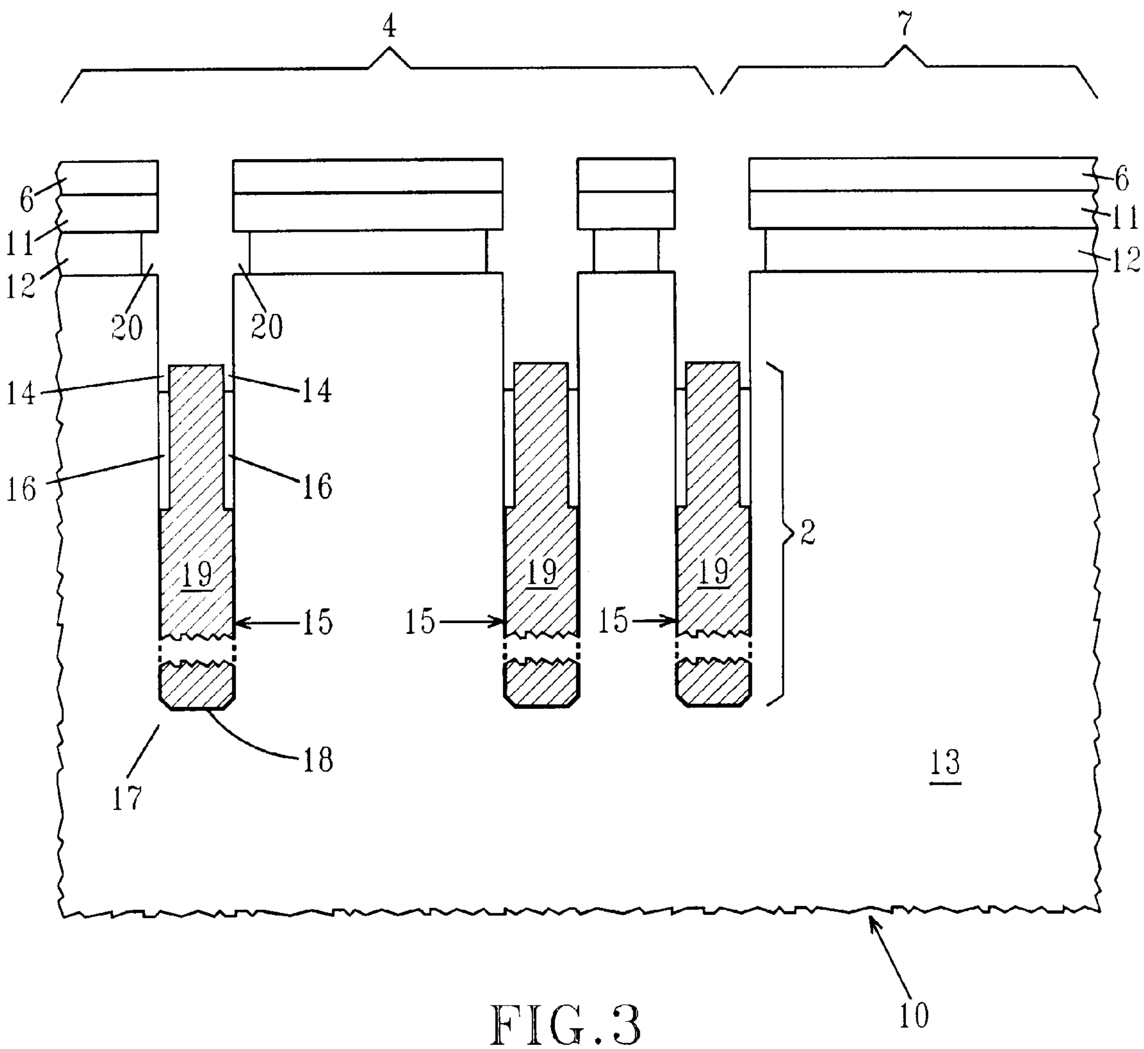

Referring now to FIG. 3, the trench regions 15 are then filled with the material of the upper capacitor plate 19. The fill material typically includes arsenic doped polysilicon. The fill material is typically deposited using deposition processes well known in the art including: chemical vapor deposition (CVD), low pressure CVD (LPCVD), and high-density chemical vapor deposition (HDCVD). Preferably, when utilizing polysilicon for the upper capacitor plate 19 material, during formation the fill material may be in-situ doped with n-type dopants Following deposition, the doped fill material is then recessed using a wet etch process. Preferably, the etch chemistry is selective for removing doped polysilicon without substantially etching the collar 16 or the node dielectric 18. Preferably, the doped fill material is recessed below the buried insulating region 12 of the SOI substrate 10. The storage capacitor 2 in each trench comprises a lower capacitor plate 17, a node dielectric 18, and an upper capacitor plate 19. The recessed doped fill material provides the upper capacitor plate 19, which is hereafter referred to as the capacitor node 19.

In a next process step, an isotropic etch laterally etches a portion of the insulating region 12 that abuts the sidewall of the trench regions 15, and recesses the top surfaces of the collar 16 below the top surface of the capacitor node 19. Once the top surface of the collars 16 are recessed the exposed portions of the node dielectric 16 are removed from the top portion of the trench.

The laterally etched portion of the buried insulating region 12 provides a divot 20 that is subsequently formed with doped polysilicon to produce the upper strap diffusion region. The recessed portion 14 of the collar 16 is positioned to provide the location of the subsequently formed lower strap diffusion region.

The isotropic etch may be provided by any etch process having non-directional etch properties selective to etching the buried insulating layer 12 and the collar 16 without substantially etching the trench region 15 sidewalls. Preferably, the isotropic etch is a wet chemical etch having high selectivity to removing $SiO_2$ from the buried insulating layer 12 and the collars 16, without substantially etching the $Si_3N_4$ patterned pad dielectric 6, the SOI layer 11, capacitor node 19, and portions of the trench sidewall that do not abut the insulating layer 12.

Figure 4:
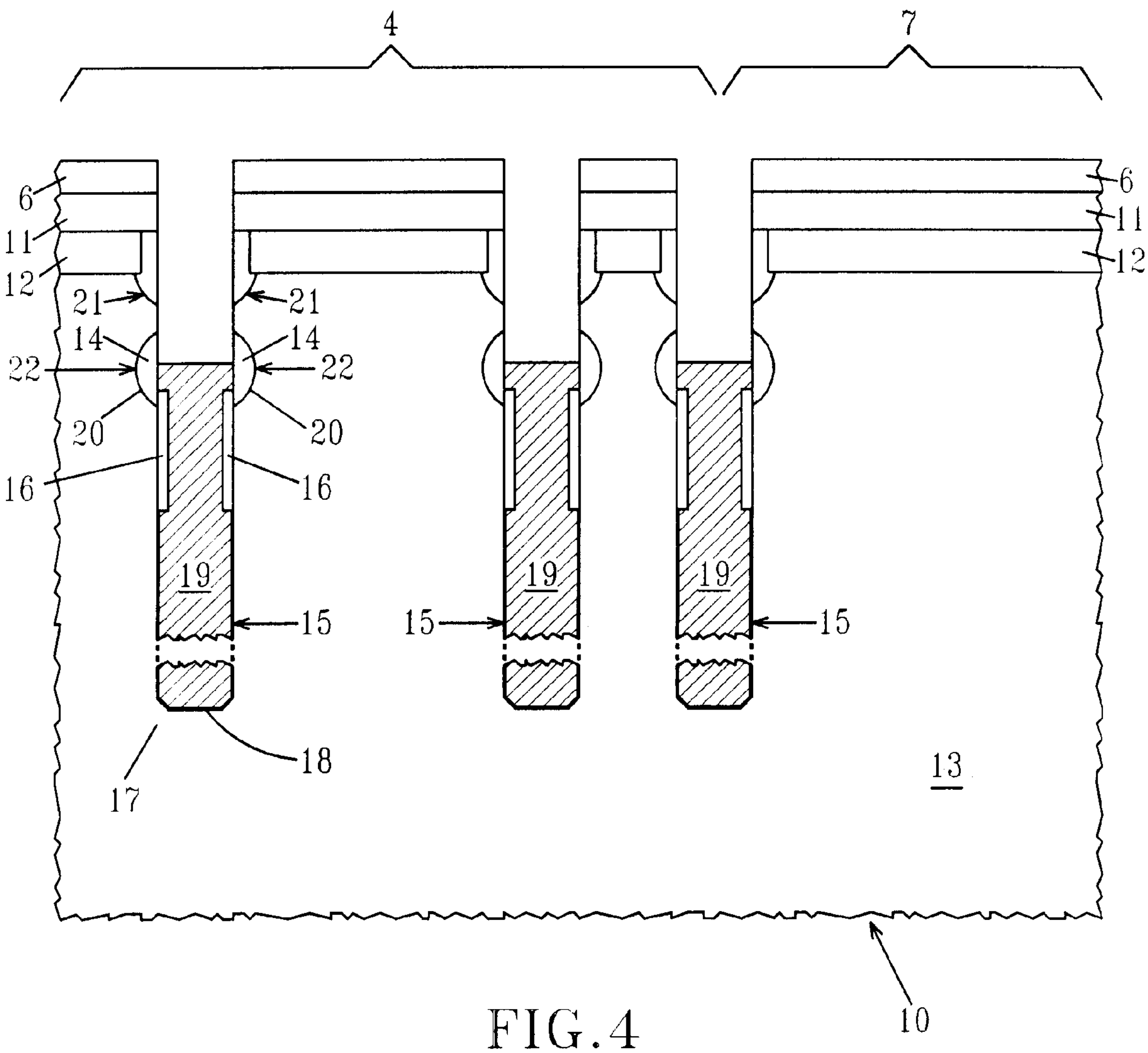

Referring now to FIG. 4, doped polysilicon is then formed within the divot 20 and recessed portion 14 of the collar 16 by deposition and etching, wherein the dopant subsequently diffuses into the substrate to produce the upper strap diffusion region 21 and lower strap diffusion region 22. Specifically, a polysilicon liner is deposited using a conformal deposition process including chemical vapor deposition processes, such as plasma enhanced chemical vapor deposition or low-pressure chemical vapor deposition. The polysilicon liner is in-situ doped during deposition to provide electrical conductivity. The polysilicon liner is preferably doped to have an electrical conductivity that is similar to the upper silicon-containing portion of the SOI layer 11, most preferably being n-type doped, in which the dopant is arsenic.

The polysilicon liner is then etched using a combined anisotropic and isotropic etch process. In one embodiment, the combined anisotropic and isotropic etch process comprise a reactive ion etch (RIE) process including $SF_6$ feed gas; a chemical dry etch process including $CF_4$ feed gas; and/or a wet chemical etch including $NH_4OH$. Other etch chemistries are also contemplated, so long as a portion of the polysilicon liner remains within the divot 20 and atop the recessed portion 14 of the collar 16. The dopant diffuses from the polysilicon positioned within the divot 20 and from atop the recessed portion of the collar 16 into the substrate 13 during thermal processing to produce the upper strap diffusion region 21 and the lower strap diffusion region 22. In accordance with the present invention, the upper strap diffusion regions 21 and the lower strap diffusion regions 22 function as the source and drain regions of the subsequently formed access transistors.

In another embodiment, the upper strap diffusion region 21 and lower strap diffusion region 22 may be formed on only one side of the trenches 15, to prevent electrical interaction with the strap regions of adjacent memory devices. The one sided strap is provided by an etch process which only selectively etches the collar 16 on one sidewall of the trench 15. Etch selectivity is provided on one side of the trench by implanting boron into one sidewall of the trench using angled implants. An etch chemistry having a highly selective for removing the portion of the trench sidewall doped with boron is then utilized to provide a divot 20 on one side of the trench.

Figure 5:
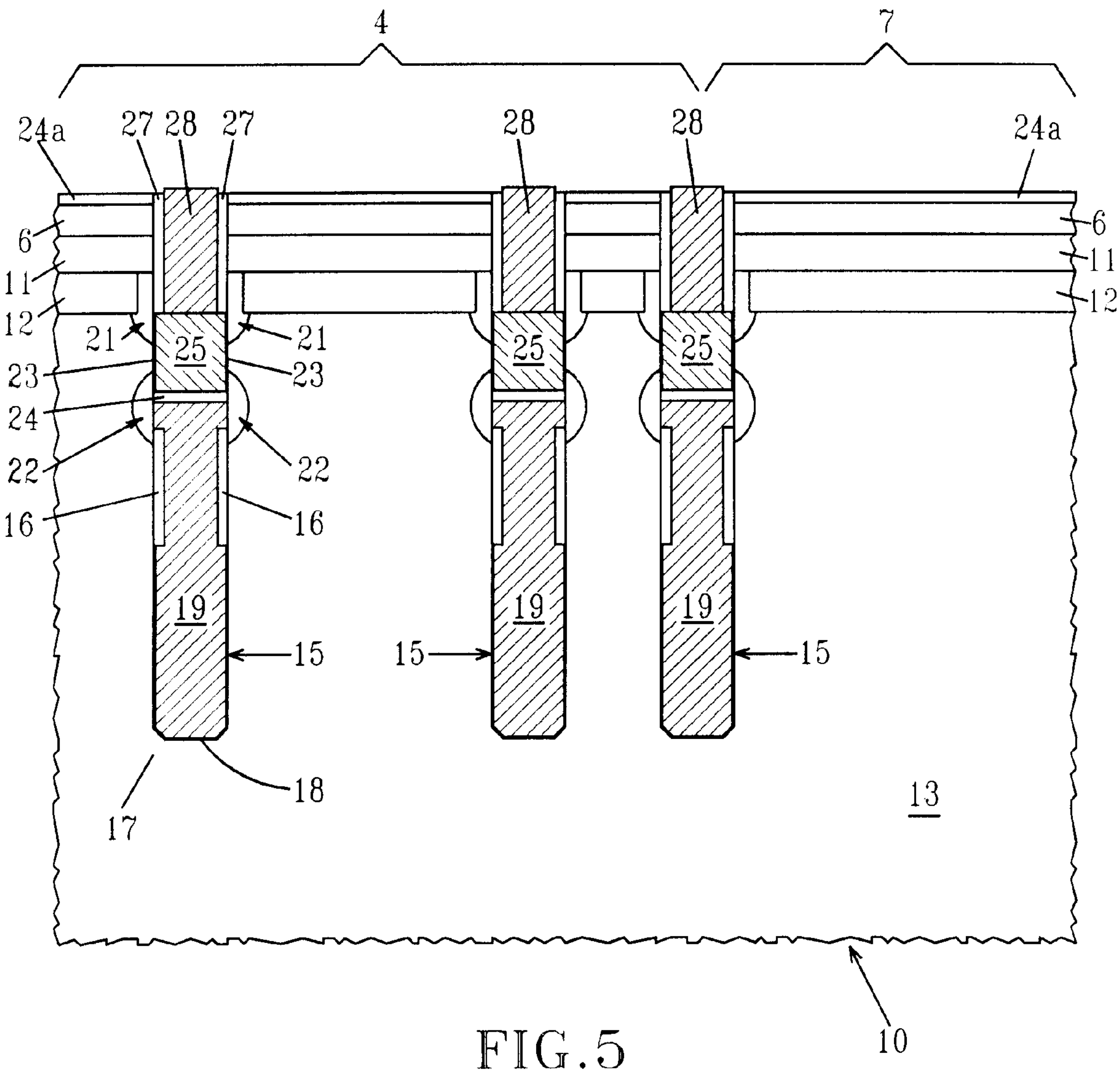

Referring now to FIG. 5, a sacrificial oxide layer (not shown) is then grown by thermal oxidation on the trench sidewalls. Following, sacrificial oxide growth a trench top oxide (TTO) layer 24 is formed atop the capacitor node 19 by high-density plasma chemical vapor deposition (HD-PCVD). An oxide 24*a* can also be formed atop the patterned dielectric layer 6. The trench top oxide (TTO) 24 can be any oxide, preferably being $SiO_2$. The thickness of the trench top oxide (TTO) 24 may range from about 15 nm to about 40 nm.

In a next process step, an etch process removes HDPCVD oxide that may have formed on the trench sidewalls and removes the sacrificial oxide layer. The etch process may be a timed wet chemical etch selective to the trench sidewalls having an etch chemistry that preferably comprises HF.

A gate dielectric layer 23 is then formed by thermal oxidation, preferably being $SiO_2$. Alternatively, the gate dielectric layer 23 may be formed by conventional deposition and etch processes. The thickness of the gate dielectric 23 typically ranges from about 2 nm to about 10 nm.

Still referring to FIG. 5, a gate conductor layer 25 is then deposited by a deposition process, such as chemical vapor deposition (CVD), plasma-assisted CVD, high-density chemical vapor deposition (HDCVD), plating, sputtering, evaporation and chemical solution deposition. The gate conductor material is preferably polysilicon doped with arsenic but may also be comprised of metal silicides, metallic nitrides, metals (for example W, Ir, Re, Ru, Ti, Ta, Hf, Mo, Nb, Ni, Al) or other conductive materials. Following deposition, the gate conductor layer 25 is then etched back to below the buried insulator layer 12.

Insulating spacers 27 are then formed along the trench sidewall from the top surface of the patterned pad dielectric 6 to the gate conductor 25. The insulating spacers 27 can be formed by conventional deposition and etch processes. The insulating spacers 27 are comprised of a dielectric such as a nitride, oxide, oxynitride, or a combination thereof, preferably being $Si_3N_4$. The thickness of the insulating spacers 27 typically ranges from about 15 nm to about 25 nm.

Following insulating spacer 27 formation, a gate contact 28 is formed atop the gate conductor 25. The gate contact 28 is preferably doped polysilicon, but may also comprise other conductive materials. The gate contact 28 may be blanket deposited by a deposition processes and is then planarized so as to be coplanar with the oxide 24*a*, preferably by chemical mechanical polishing. The oxide 24*a* is then removed from the patterned dielectric layer 6 using an etch process.

Figure 6:
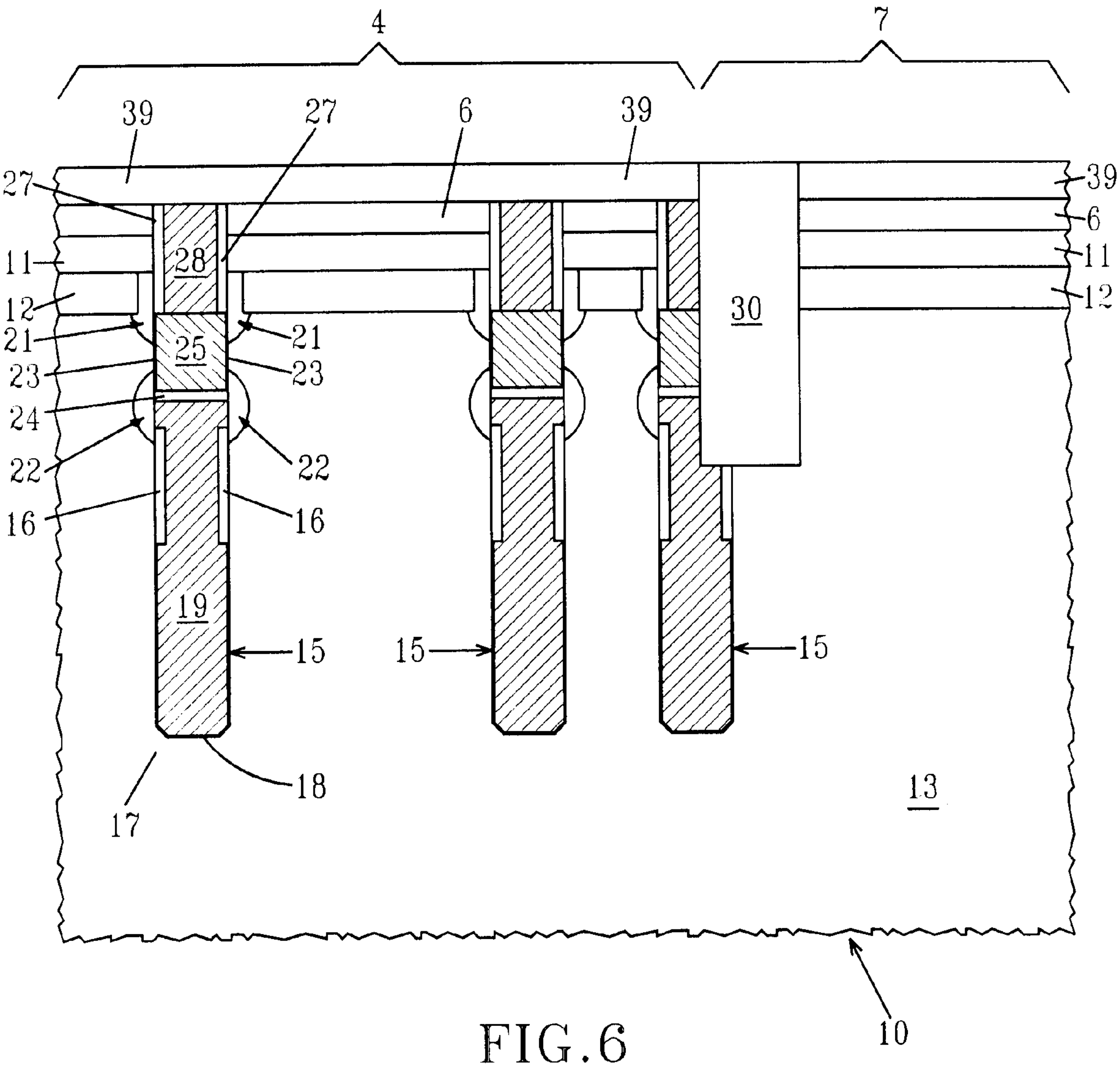

Turning now to FIG. 6, an isolation region 30 is then formed in the SOI substrate 10 that separates the support region 7 from the array region 4 of the device. The array region 4 typically includes the memory devices. The support region 7 typically includes logic devices, such as nFETs and pFETs.

The isolation region 30 may be an isolation trench extending from the top surface of the device to a depth greater than the buried insulating layer 12. The depth of the isolation region is not critical to the present invention, so long as the isolation trench suppresses electrical interaction between the array 4 and support 7 regions through the substrate.

An isolation trench may be provided using deposition, photolithography, and etching. For example, a wiring level dielectric layer 39 may be first formed in a manner similar to the patterned pad dielectric layer 6, beginning with chemical vapor deposition (CVD) of a dielectric material, which may include nitrides, oxides, oxynitrides or a combination thereof. Preferably, the wiring dielectric layer 39 comprises $Si_3N_4$.

The wiring dielectric layer 39 is then patterned to provide an etch mask for the subsequently formed isolation region 30 using conventional photoresist deposition, photoresist patterning and pattern development. The pattern is then transferred into the wiring dielectric layer 39 by conventional etch processes.

The isolation region 30 is then formed by etching a trench into the SOI substrate 10, in which the patterned wiring dielectric layer 39 functions as an etch mask. The etch process may be any dry etching process such as reactive-ion etching (RIE) or plasma etching.

Following etching, CVD or another like deposition process is used to fill the trench with polysilicon or another like dielectric material. The isolation region dielectric may also be high-density oxide, such as high density $SiO_2$, deposited by high-density plasma chemical vapor deposition (HDPCVD). A planarization process can be used to provide an isolation structure coplanar with the top surface of the wiring dielectric layer 39.

Figure 7:
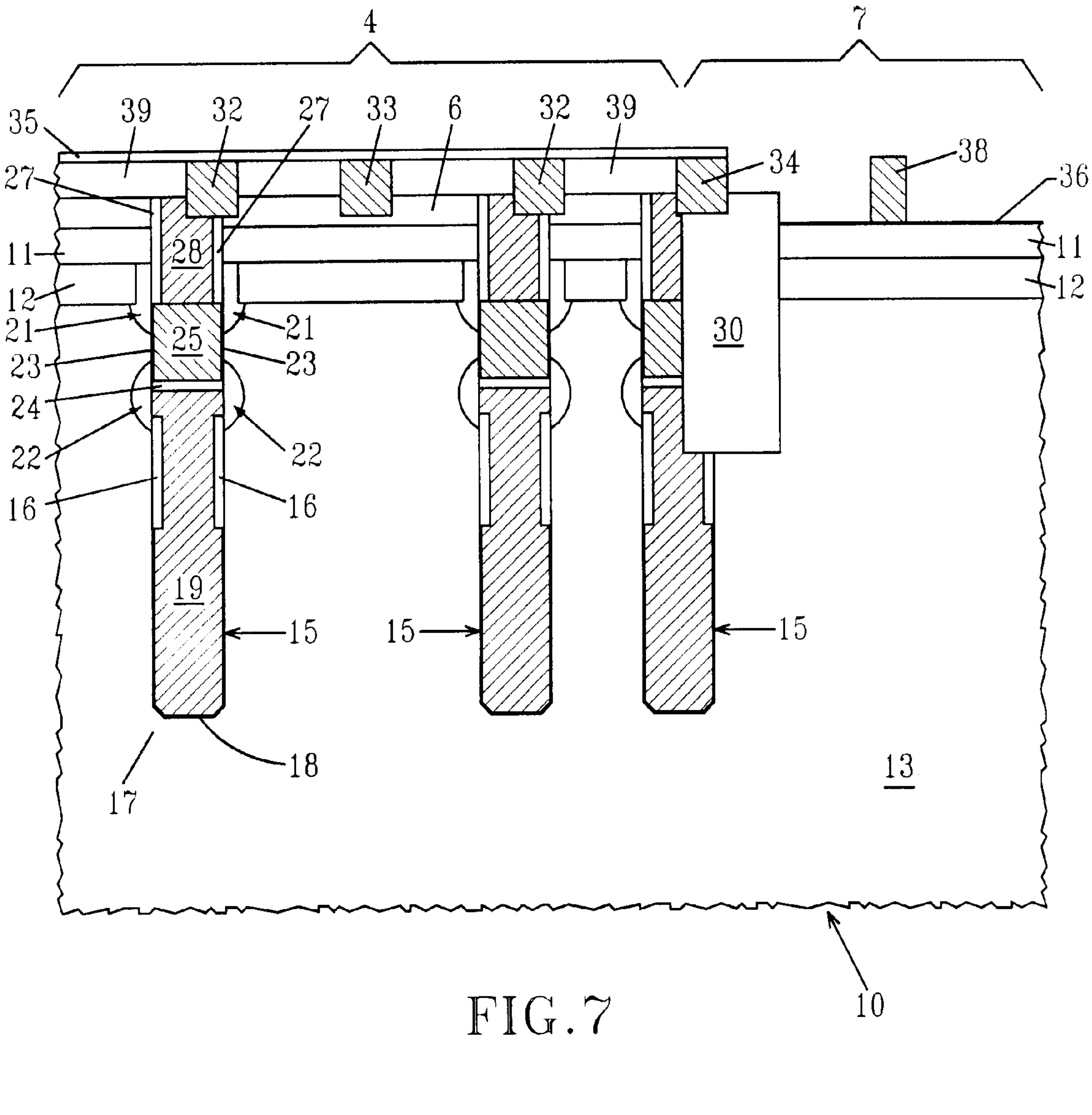

Referring now to FIG. 7, array region wiring 32, 33, 34 is then formed within the wiring dielectric layer 39. The array region wiring 32, 33, 34 may include active wordlines 32, passive wordlines 33, and trench wiring 34. The active and passive wordlines 32, 33 provide electrical communication to the memory devices of the array region 4, therefore turning them on and off. The active wordlines 32 are in electrical contact with the memory devices of one row of memory devices, as depicted in FIG. 7, which represents one cross-section of one embodiment of the present invention. The passive wordline 33 are in electrical contact with another row of memory devices. The trench wiring 34 functions to connect the active wordlines 32 and passive wordlines 33 to the peripheral wiring of the device.

The array region wiring 32, 33, 34 is produced using conventional photolithography and etching. Specifically, a wiring etch mask comprising conventional photoresist is produced that exposes portions of the wiring dielectric layer 39, in which the active wordlines 32, passive wordlines 33, and trench wiring 34 are subsequently formed. The wiring etch mask can be a chrome negative mask.

The exposed portions of the wiring dielectric layer 39 are then removed using a highly selective etch process, which does not substantially etch the wiring etch mask. The etch process may be a directional etch process, such as reactive ion etch (RIE). The etch process may be timed or may utilize end point detection methods. Following etch, the wiring etch mask can be stripped using a conventional chemical strip.

A conductive material that forms the active word line 32, passive word line 33, and trench wiring 34 may then be blanket deposited atop the entire top surface of the device, including the etched portion of the wiring dielectric layer 39. The conductive material is preferably doped polysilicon but can also be comprised of metal silicides, metallic nitrides, metals (for example W, Ir, Re, Ru, Ti, Ta, Hf, Mo, Nb, Ni, Al) or other conductive materials. The conductive material may be deposited using deposition processes including chemical vapor deposition (CVD), plasma-assisted CVD, high-density plasma chemical vapor deposition (HDPCVD), plating, sputtering, evaporation and chemical solution deposition. Preferably, active word line 32, passive word line 33, and trench wiring is formed using n-type doped polysilicon. Following deposition, the conductive material can be planarized back so that the top surface of the array wiring 32, 33, 34 is coplanar with the top surface of the wiring dielectric level 39.

Still referring to FIG. 7, an array region hardmask 35 is then formed atop and protecting the array region 4 of the device, while the support region 7 is exposed. The array region hardmask 35 may comprise any conventional hardmask material deposited by chemical vapor deposition means including silicon oxides, silicon carbides, silicon nitrides, silicon carbonitrides, etc. Alternatively, the hardmask layer may be deposited by spin-on methods, where the composition of the spin-on applied hardmask layer may include, but is not limited too: silsequioxanes, siloxanes, and boron phosphate silicate glass (BPSG). Preferably, the array region hardmask 35 is an oxide, such as $SiO_2$, deposited by chemical vapor deposition having a thickness ranging from about 20 nm to about 50 nm.

Following the formation of the array region hardmask 35, the exposed portion of the substrate 10 is etched to remove the wiring dielectric layer 39 and the pad dielectric layer 6 from the support region 7. This etch process may comprise any etch process, such as wet or dry etch processes, having high selectivity to removing the wiring dielectric layer 39 and the pad dielectric layer 6 without substantially etching the array region hardmask 35, the trench wiring 34, or the SOI layer 11.

The support region 7 can then be processed to provide logic devices, preferably beginning with the support well implant of the SOI layer 11. The SOI layer 11 may be implanted to form a n-type or p-type channel for the subsequently formed logic devices. Although the support region 4 of the present invention has been depicted using a single logic device for the purposes of clarity, multiple devices may be processed within the support region 4 using block-masks produced using conventional photolithography processes well known within the art.

Following support well implant, a gate dielectric 36 is then formed atop the SOI layer 11 of the support region 7. After the gate dielectric 36 has been formed, a gate conductor 38 is formed atop the gate dielectric 36 within the support region 4 by a deposition process (such as CVD, plasma-assisted CVD, plating, sputtering and etc.) followed by etching. It is noted that during support region 7 processing the array region 4 is protected by the array region hardmask 35.

Figure 8:
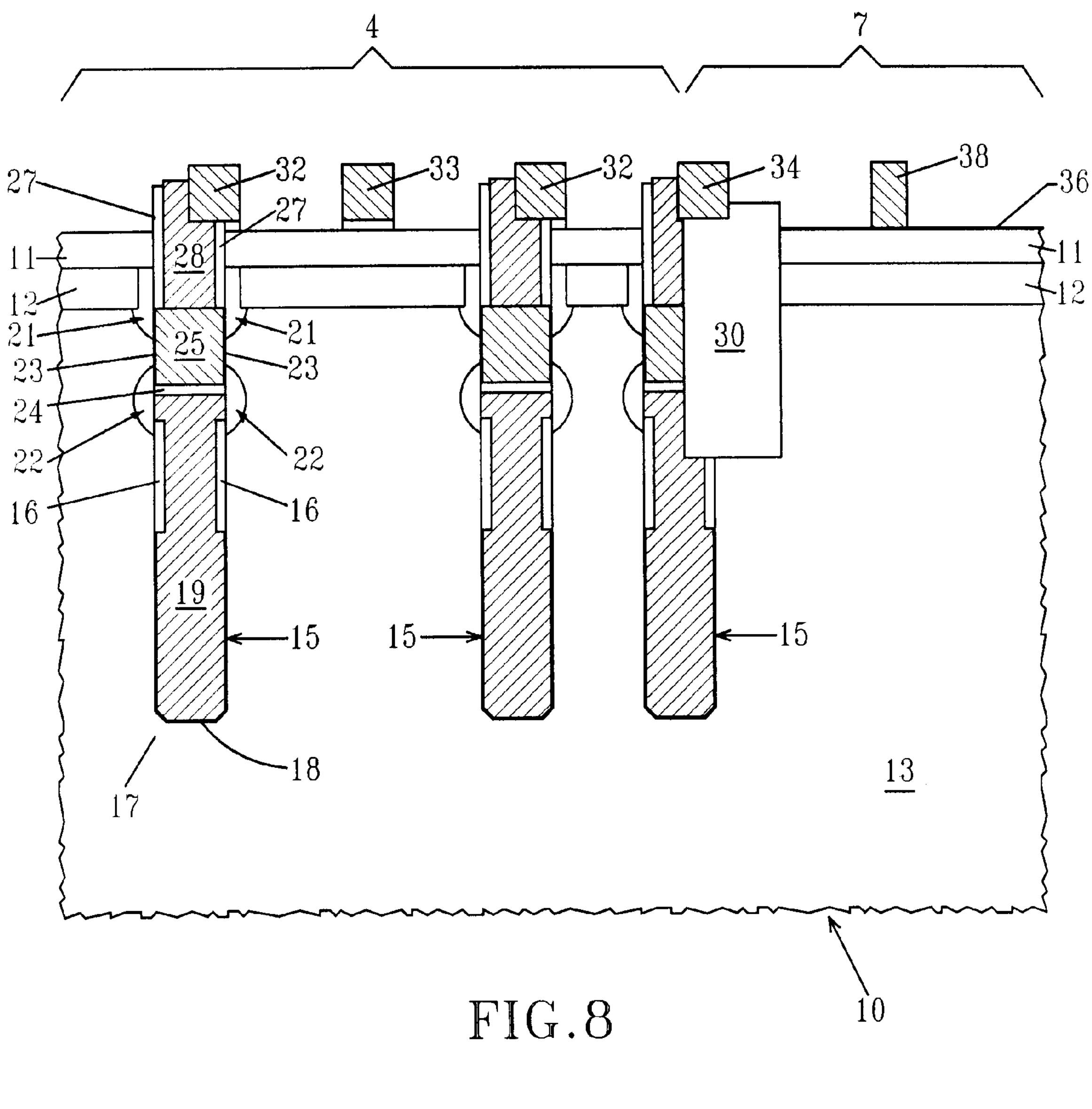

Now referring to FIG. 8, in a next process step a photoresist mask is formed atop the support region 7 and the array region 4 is exposed. The array region 4 is then etched to remove the array region hardmask 35, the wiring dielectric layer 39, and the pad dielectric layer 6. Specifically, the array region 4 may be etched using a directional etch process, such as reactive ion etch (RIE), having high selectivity to removing the array region hardmask 35, the wiring dielectric layer 39, and the pad dielectric layer 6 without substantially etching the photoresist mask, active word line 32, passive word line 33, trench wiring 34 and SOI layer 11. Thereafter, the photoresist is stripped from the support region 7 using a conventional chemical strip.

Figure 9:
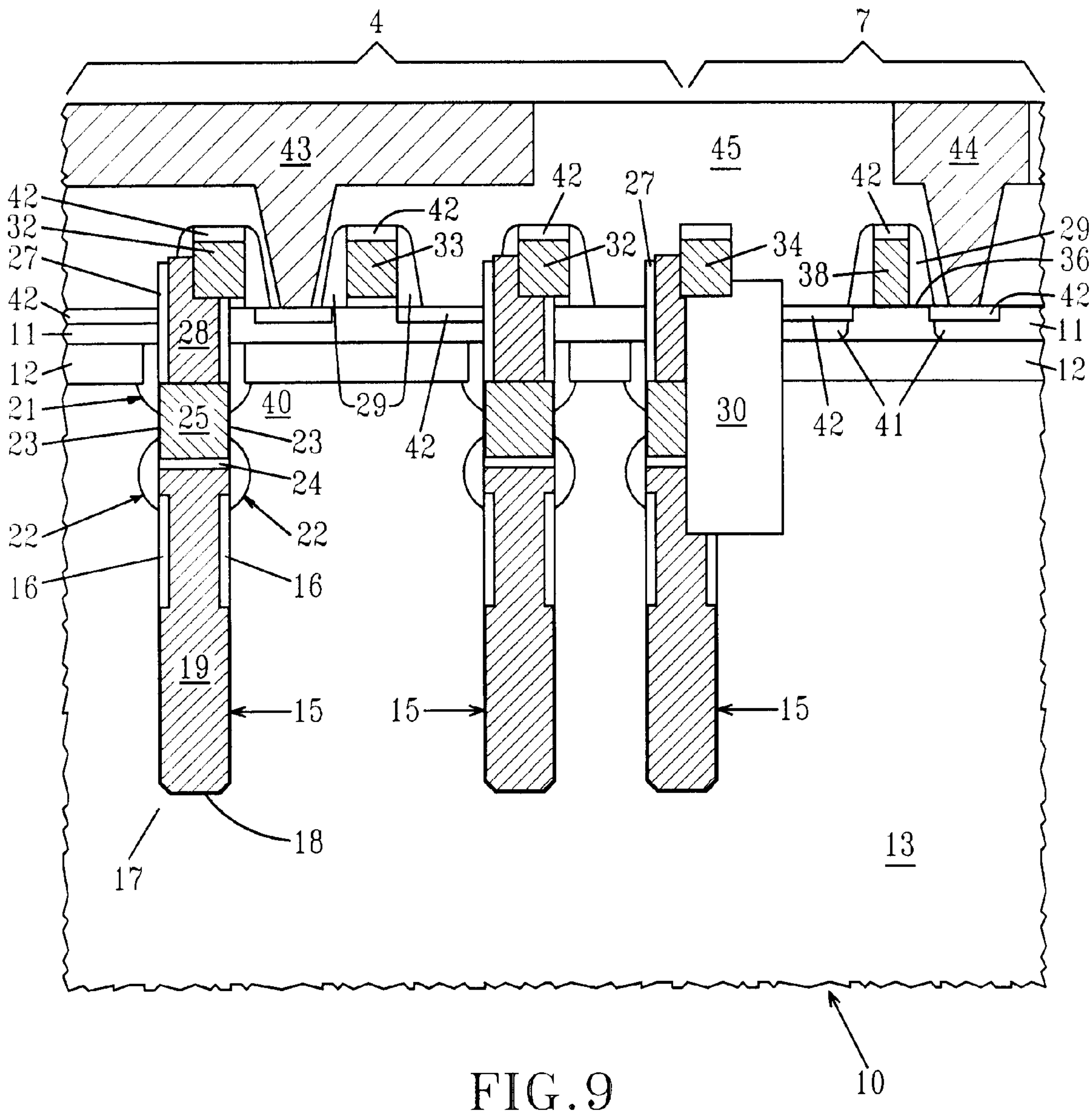

Referring to FIG. 9, insulating spacers 29 are then formed abutting the active word line 32, the passive word line 33, and the gate conductor 38 within the logic region 7. The insulating spacers 29 are formed using conventional deposition and etch processes. The insulating spacer 29 material may comprise a dielectric such as a nitride, oxide, oxynitride, or a combination thereof.

Following insulating spacer 29 formation, a photoresist block mask (not shown) is formed atop the support region 7 of the SOI substrate 10 and the array region 5 is implanted to form the channel region 40 of the vertical transistor 3 that is positioned atop the capacitor 2 of each memory device. The channel 40 may be formed by implanting p-type dopants with an implant energy sufficient to position the channel dopants between upper strap diffusion region 21 and the lower strap diffusion region 22, where the upper strap diffusion region 21 functions as the source of the transistor 3 and the lower strap diffusion region 22 functions as the drain of the transistor 3. Preferably, a $p^-$ channel is formed by p-type dopants. Following channel implantation, the photoresist block mask is removed from the support region 4 using a chemical strip.

Still referring to FIG. 9, a photoresist block mask is then formed atop the array region 4 and the support region 7 is processed to produce source/drain regions 41 for the logic devices. Similar to the well implant of the support region 4, the source/drain regions 41 of multiple devices may be processed within the support region 4 using block-masks, where the block-mask application and implantation procedure can be repeated to dope selected regions of the SOI layer 11 to provide differently doped source/drain regions, requiring either n-type or p-type dopants, for the different types of logic devices.

In a next process step, silicide regions 42 are formed to provide electrical contacts for the subsequently formed interconnects, including the bitline 43 and the support region contact 44. It is noted that silicide is not formed atop the insulating spacers 29. A silicidation process is not required to provide electrical contact for the subsequently formed interconnects. Alternatively, the electrical contacts for the subsequently formed interconnects may comprise a metal, such as W.

Following silicide formation, a layer of dielectric material 45 is blanket deposited atop the entire substrate and planarized. The blanket dielectric 45 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or a poly (arylene ether) such as SiLK™; other carbon-containing materials; organo-inorganic materials such as spin-on glasses and silsesquioxane-based materials; and diamond-like carbon (DLC, also known as amorphous hydrogenated carbon). In a preferred embodiment, the dielectric layer is spin-on borophososilicate glass (BPSG).

Once planarized the dielectric layer 45 is then etched to provide via openings to the silicide contacts 42 of the array region 4 and the support region 7, in which the bitline 43 and support region interconnect 44 are subsequently formed. The via openings are formed by conventional photolithography and etch process steps well known within the art.

Following via formation the bitline 43 and the support region interconnect 44 are formed by depositing a conductive metal into the via holes using conventional processing, such as sputter or plating. The conductive metal may include, but is not limited to: tungsten, copper, aluminum, silver, gold, and alloys thereof. Alternatively, the bitline 43 and support region interconnect 44 may be formed by depositing doped polysilicon into the via holes.

In another embodiment, the via opening for the bitline 43 may be utilized to produce a body contact. An etch process may be conducted through the via opening and implants can be introduced using multiple energies so that the SOI layer 11 and the bulk silicon-containing substrate 13 maybe similarly doped. This embodiment allows for a body contact to be produced without additional trench formation.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A device comprising:

a substrate comprising a silicon-containing layer atop an insulating layer;

at least one trench within said substrate, said at least one trench comprising a divot laterally extending from a trench sidewall into said insulating layer;

a capacitor in a lower portion of said at least one trench; and a transistor in an upper portion of said at least one trench, said transistor in electrical contact to said silicon-containing layer of said substrate through an upper strap diffusion region partially positioned within said divot.

2. The device of claim 1 wherein said divot comprises doped polysilicon.

3. The device of claim 1 wherein said transistor and said capacitor are separated by a trench top oxide layer.

4. The device of claim 3 wherein said transistor comprises a gate region, said gate region comprising a gate dielectric formed on sidewalls of said upper portion of said trench and a polysilicon gate formed atop said trench top oxide layer.

5. The device of claim 4 wherein said transistor further comprises a source and a drain, said drain being a lower strap diffusion region positioned to provide electrical communication between said transistor and said capacitor, said source being said upper strap diffusion region.

6. The device of claim 5 wherein said drain and said source comprise a first conductivity-type dopant and a portion of said substrate positioned between said drain and said source is doped with a second conductivity-type dopant.

7. The device of claim 4 wherein said substrate further comprises an array region and a support region separated by an isolation region, said array region including said at least one trench and said support region comprising logic devices, said logic devices comprising polysilicon gate devices having logic source/drain regions formed in said silicon containing layer.

8. The device of claim 6 wherein said array region further comprises active wordlines in electrical communication with said transistor in the at least one trench, wherein electrical communication is provided through a transistor junction within said at least one trench and contacting said gate region of said transistor.

9. The device of claim 1 wherein a bitline contacts said silicon-containing layer and is in electrical contact to said transistor through said upper strap diffusion partially positioned in said divot in said buried insulator layer.

10. The method of claim 1 wherein said divot is on one side of the trench.

* * * * *